United States Patent [19]

Chételat et al.

[11] 4,011,557

[45] Mar. 8, 1977

[54] DEVICE IN A TIME PIECE FOR FEEDING AN ELECTRO-LUMINESCENT DISPLAY

[75] Inventors: Fernand Chételat, Cortaillod; Pierre Hersberger, Neuchatel, both of Switzerland

[73] Assignee: Ebauches S.A., Neuchatel, Switzerland

[22] Filed: May 13, 1975

[21] Appl. No.: 576,976

Related U.S. Application Data

[63] Continuation-in-part of Ser. No. 495,044, Aug. 5, 1974.

[30] Foreign Application Priority Data

Aug. 23, 1973 Switzerland ..................... 12120/73

[52] U.S. Cl. ................................ 340/336; 58/50 R; 315/240; 340/324 R

[51] Int. Cl.[2] .......................................... H01L 33/00

[58] Field of Search ........................ 340/336, 324 R; 58/50 R; 315/237, 240, 241 R

[56] References Cited

UNITED STATES PATENTS

| | | | |
|---|---|---|---|
| 3,603,833 | 9/1971 | Logan et al. | 313/499 |
| 3,630,015 | 12/1971 | Lehovec | 58/50 R |
| 3,742,699 | 7/1973 | Bergey | 58/50 R |
| 3,760,582 | 9/1973 | Thiess et al. | 58/50 R |
| 3,841,087 | 10/1974 | Kikuchi | 58/50 R |

*Primary Examiner*—David L. Trafton
*Attorney, Agent, or Firm*—Imirie, Smiley & Linn

[57] ABSTRACT

It is known that an electro-luminescent display increases its light emitting efficiency with the current through it. Such a display in a watch run from a small battery, is fed by short impulses of high-intensity current by means of discharges from two capacitors which are alternately charged and discharged by transistor switches opened and closed by externally supplied impulses. The battery current is thus kept substantially constant and low. A series of digits or segments thereof, if used, may be fed in sequence with the impulses.

11 Claims, 6 Drawing Figures

DEVICE IN A TIME PIECE FOR FEEDING AN ELECTRO-LUMINESCENT DISPLAY

This is a continuation-in-part of application Ser. No. 495,044, filed Aug. 5, 1974.

BACKGROUND OF THE INVENTION

The present invention concerns a device in a time piece for feeding an electro-luminescent display with impulses.

A means for replacing the mechanical display in a time piece consists in using electro-luminescent diodes (called "LED") for forming the display symbols, the current consumption of which is relatively low. This is an advantage in watches operated from batteries. It is known that these LED diodes have a luminous yield which increases with the current traversing the diodes. On this account FIGS. 1 and 2 show for two types of diode, the relative yield $\eta$ as a function of the current.

For a watch battery, a current of 100 mA represents a high consumption: however, for a watch display, it is not necessary to feed the current continually to the LED which is to be lit up: it can be impulse-operated provided that the illumination frequency does not fall below 30Hz. Above that frequency, a human eye sees the light emitted as constant. A system for supplying LED diodes by impulses is known in which the current is induced in a coil by a commutator. However, present-day batteries have internal resistances which are relatively high and cannot readily provide the peak currents necessary.

SUMMARY OF THE INVENTION

According to the present invention there is provided a device for feeding an electro-luminescent display assembly with impulses, wherein means are provided for first charging at least one capacitor and subsequently discharging it through an electro-luminescent display member.

DETAILED DESCRIPTION OF THE INVENTION

Figure 1:
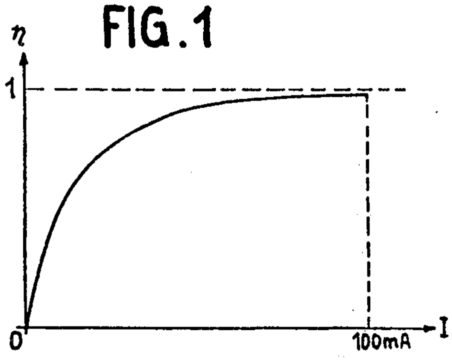
FIGS. 1 and 2 are light output ($\eta$) curves as a function of current for different types of diodes.
Figure 2:
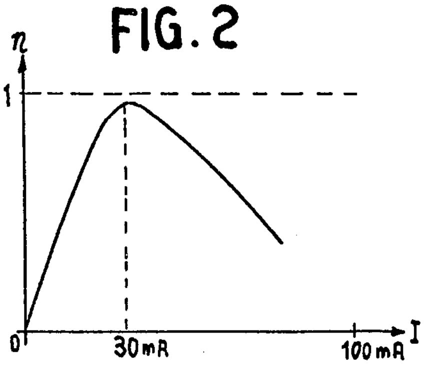
Figure 3:
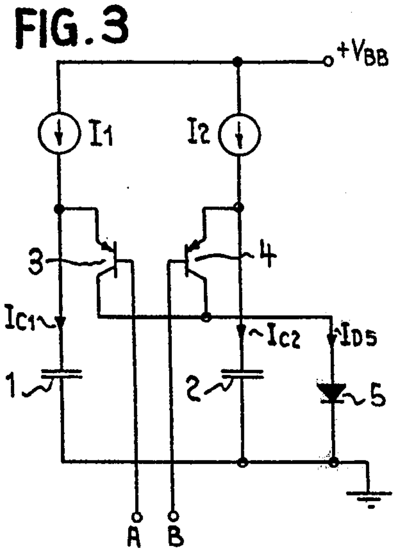
FIG. 3 is a circuit embodying the invention.

If a capacitor is charged through a resistance from a source of current and then discharged through an LED, the current from the feed source of the device would be in the form of impulses, and it is preferable that this current is constant. To fulfill this condition, as shown in FIG. 3, two capacitors are used, which are charged and discharged alternately. In FIG. 3 two capacitors 1 and 2 are respectively charged via current paths I1 and I2 connected to a feed source or battery $+V_{BB}$ and the capacitors 1 and 2. The positive terminals of the capacitors are connected to the emitters of two transistors 3 and 4 the collectors of which are connected in common to the anode of an LED 5 the cathode of which is grounded.

Figure 4:
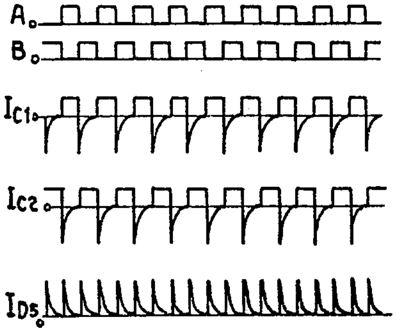
FIG. 4 is a set of curves which shows the currents at various points of FIG. 3.

The bases of the transistors 3 and 4 are supplied with impulse trains A and B (FIG. 4). The two trains are complementary so that at each period of the signal A or B, a discharge of the respective capacitor 1 or 2 takes place via the LED 5. FIG. 4 also shows the charge currents $I_{C1}$ and $I_{C2}$ as well as the current traversing the diode 5; so that while a capacitor 1 or 2 is discharging or while a transistor (3 or 4 respectively) is open, the corresponding current path (I1 or I2 respectively) carries no current. However, the sum of the currents $I_{C1}$ and $I_{C2}$ minus the current $I_{D5}$ (which is the current supplied solely by the capacitors), shows that the battery $+V_{BB}$ current is practically constant.

If it is necessary to adapt the device to a display composed of digits having seven segments plus a point (eight elements per digit) this involves the use of eight capacitors, though it is difficult to include such capacitors in an integrated circuit.

Figure 5:
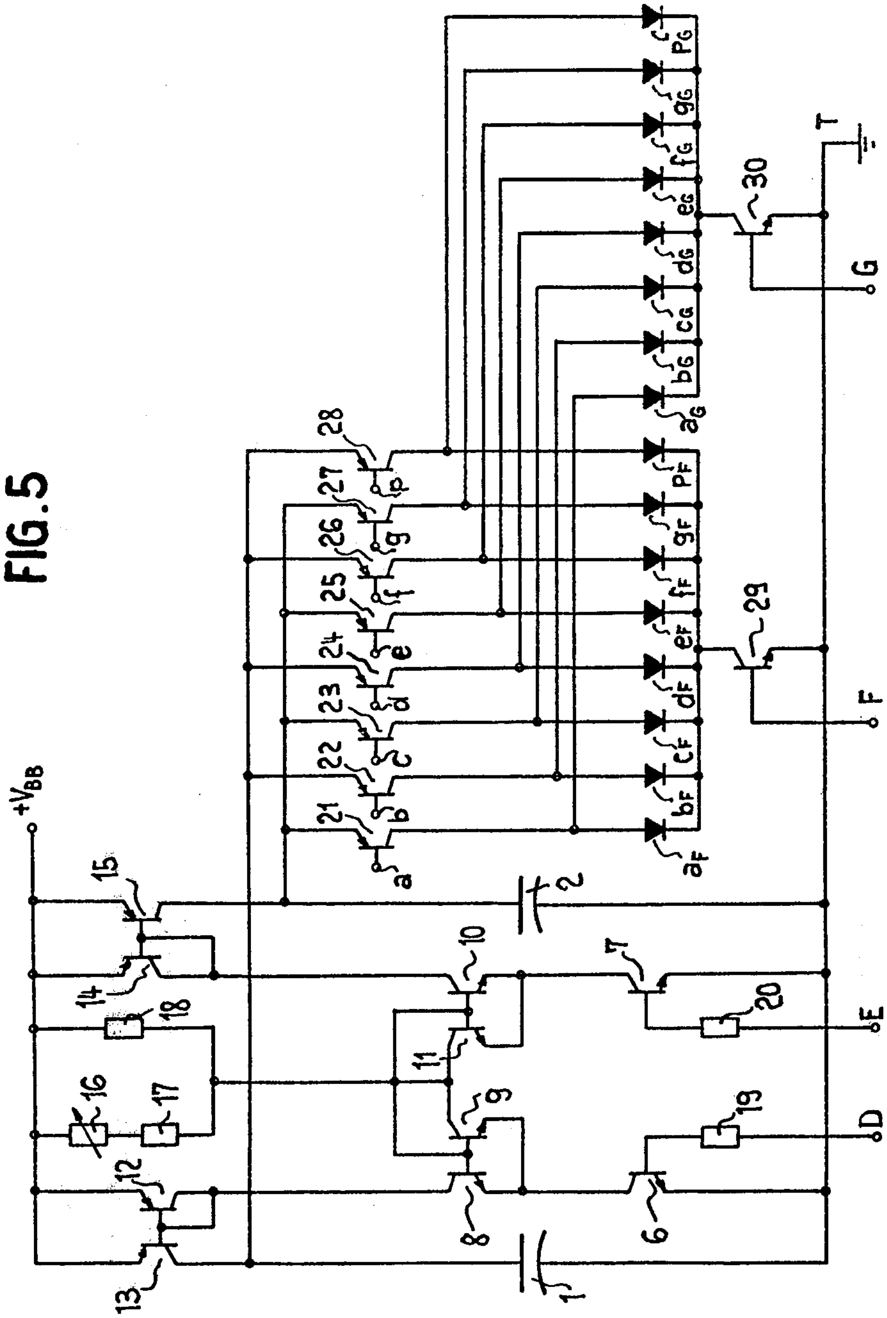
FIG. 5 is a circuit diagram of a device in accordance with the invention for a display device having two digits of seven segments and one point.

FIG. 5 shows a circuit where the digits are displayed sequentially and where the digit segments are successively fed by two capacitors discharging and charging alternately, so that a multiplexing of the display is effected.

FIG. 5 shows the capacitors 1 and 2 of FIG. 3. The current feed to the capacitor 1 is derived from a symmetrical pair of transistors 12 and 13 the emitters of which are connected to the battery $+V_{BB}$. The collector of transistor 13 is connected to one of the terminals of capacitor 1, the other terminal of which is grounded at T. The collector of transistor 12 to which are connected the bases of transistors 12 and 13, is connected to the collector of transistor 8 which forms, with a transistor 9, another symmetrical pair. Their bases and the collector of transistor 9 are connected to the battery $+V_{BB}$ by a resistor network composed of a photoresistor 16 in series with a resistor 17 and, in parallel with these latter, a resistor 18. The emitters of transistors 8 and 9 are connected to the collector of a transistor 6 the emitter of which is connected to ground. Transistor 6 receives impulses D (similar to pulses A) on its base, via a resistor 19. The part of the circuit just described forms a charge system for the first capacitor 1. The impulses D open and close the transistor 6. When this latter is open (or conductive) the resistor network 16, 17, 18 determines the current passing through transistor 9; the current passing through transistor 8 is thus determined by the relationship between the bases of transistors 8 and 9. The same effect is produced in the combination 12, 13 to provide a charge current having an impulse form for the capacitor 1. Parallel to this circuit for capacitor 1, there is a similar circuit for capacitor 2, composed of a first symmetrical pair of transistors 14 and 15, a second pair of transistors 10 and 11 and a switching transistor 7 which receives impulses E (similar to pulses B) on its base via a resistor 20. The pair 10 and 11 utilizes the same resistance network 16, 17 and 18 to define its current like transistors 8, 9. The first display digit is composed of segments formed by the LED's $a_F$, $b_F$, $c_F$, $d_F$, $e_F$, $f_F$, $g_F$ and a point formed by LED $P_F$; in the same manner the second digit comprises the LED's $a_G$, $b_G$, $c_G$, $d_G$, $e_G$, $f_G$, $g_G$, and $P_G$. The cathodes of the diodes $a_F$ to $P_F$ are all connected to the collector of a control transistor 29 for the first digit, the emitter of which is connected to ground and the base of which receives impulses F; the cathodes of the diodes $a_G$ to $P_G$ are connected to the collector of the control transistor 30 for the second digit, the emitter of which is likewise grounded and its base receives impulses G. The diodes forming the segments and the points of the two digits have their corresponding anodes connected in pairs, i.e. the anode of the diode $a_G$ is connected to the anode of the diode $a_F$, the anode of the diode $b_G$ is connected to that of the diode $b_F$ etc. and similarly the anode of the diode $P_G$ is connected to that of the diode $P_F$. These pairs of anodes $a_F$, $a_G$; $b_F$, $b_G$; $c_F$, $c_G$; $d_F$, $d_G$; $e_F$, $e_G$; $f_F$, $f_G$; $g_F$, $g_G$; $P_F$, $P_G$, are connected respectively to the collectors of transistors 21 to 28. The emitters of transistors 22, 24, 26, and 28 have their collectors connected to the even segments $b_F$, $b_G$; $d_F$, $d_G$; $f_F$, $f_G$ and the points $P_F$, $P_G$ and are thus connectable to the positive terminal of capacitor 1, whilst the emitters of transistors 21, 23, 25, 27, have their collectors connected to the odd segments $a_F$, $a_G$; $c_F$, $c_G$; $e_F$, $e_G$; and $g_F$, $g_G$ and are connectable to the positive terminal of the capacitor 2. The bases of the transistors 21 to 28 receive respectively the impulses *a*, *b*, *c*, *d*, *e*, *f*, *g*, and *p*.

Figure 6:
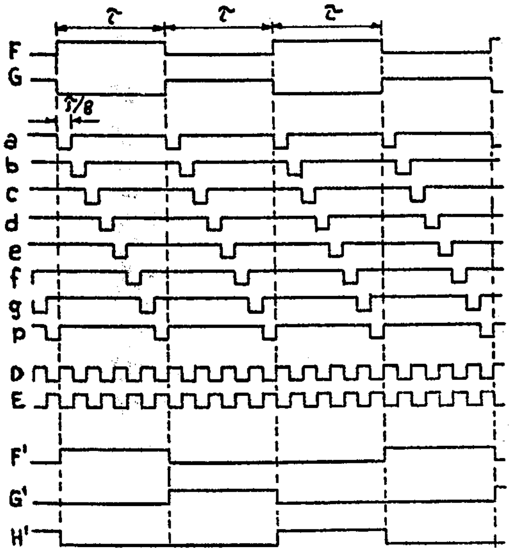
FIG. 6 is a set of curves which shows currents to illustrate the functioning of the device of FIG. 5.

FIG. 6 shows the operation of the circuit of FIG. 5, assuming that all the segments and the points of the two digits must be illuminated. The impulses F and G show that the transistors 29 and 30 are open alternately during a certain time $\tau$, the period of each signal being $2\tau$. During the time $\tau$, the signals *a* to *p* open the transistors 21 to 28 successively for a time $\tau/8$, which produces alternating discharges from the capacitors 1 and 2. The impulses D and E cause transistors 6 and 7 to alternately become conductive to in turn alternately charge capacitors 1 and 2. While one of the capacitors is discharging via a single diode, the other charges to the potential $+V_{BB}$ for eventual subsequent discharge when the corresponding diode is to be illuminated, the first capacitor being recharged at that time. For the following time $\tau$, transistor 29 is closed whilst transistor 30 opens and the process recommences for the second digit. The number of digits can be increased by connecting the anodes of the display diodes to the respective collectors of transistors 21 to 28 and by adding a control transistor for each extra digit. Thus if three control transistors are used, the control signals F′, G′ and H′ (FIG. 6) are used of which the impulse time remains $\tau$, whilst the period becomes $3\tau$. There has thus been obtained a sequential control for the digits as well as a sequential control for the segments and the point of a digit, the two capacitors alternately furnishing the necessary display current.

With this system there is always one capacitor which is charging, so that the battery current is substantially constant. On the other hand, the current through the transistor pairs is determined by the ohmic value of the resistance network 16, 17, 18, (FIG. 5). Since the photoresistor 16, varies its resistance with ambient light, a constant contrast can be maintained. For a low ambient light value, the resistance of the photoresistor 16 will be high, the network current will be low and the capacitors 1 and 2 will charge only partly so that their discharges supply only a small amount of energy to the display diodes. For a high ambient illumination, the resistance of the photoresistor 16 will be low, the current discharge high and the capacitors 1 and 2 will be charged to a higher potential; their discharges will thus supply more energy to the display diodes.

In the example of FIG. 5, the form of the impulses *a*, *b*, *c*, *d*, *e*, *f*, *g*, and *p* of FIG. 6 are such that all the segments and the points of the digits are illuminated, but by using a decoder, certain impulses (*a* and/or *b* and/or *c* etc.), can be suppressed so as only to display desired indications. If the digit F is addressed, for example, this means that the transistor 29 is open. Opening of this transistor needs a certain base current. If certain segments are not addressed, the transistor 29 can be cut off during these lapses of time, this reducing the consumption of current. In other words, the gating transistors controlling the digits of the display may be open only at the moment the gating transistors controlling segments of the corresponding digit are open to conserve power.

Again an oscillator supplying the impulses D for example, can produce any other impulses, such as the impulses E, *a*, *b*, *c*, *d*, *e*, *f*, *g*, *p*, F and G, or the impulses F′, G′ and H′. This can be effected by connecting the output of the oscillator to a cascade of flip-flop circuits the respective outlets of which may supply the necessary impulses.

We claim:

1. A device for controlling a luminescent display having plural digits each composed of plural segments, comprising at least one current source, at least one capacitor, first switching means for controlling the charging of said capacitor from said source, and second switching means coupling said capacitor with said segments for controlling the subsequent discharge of said capacitor through a selected segment of a selected digit of said display, said switching action of said second switching means being repeated at a frequency such that the display appears continuous to the eye.

2. A device as recited in claim 1, including an additional current source and an additional capacitor, said two capacitors being alternatively charged from said two current sources by said first switching means in response to input pulses and discharged through said second switching means in the display segments, said second switching means comprising transistors used as switches.

3. A device as recited in claim 2, wherein said second switching means include a transistor for each digit adapted to be sequentially opened by pulses, and a transistor for each segment adapted to be opened by further pulses in a preselected sequence.

4. A device as recited in claim 1, including means coupled with said current source for varying the current charging said capacitor in response to ambient light.

5. A device as recited in claim 4, wherein said current varying means comprises a photoresistor.

6. A device for feeding an electro-luminescent display with current pulses, comprising a current source, a pair of capacitors, and switching means coupled to said capacitors for controlling the charging and discharging thereof such that alternately each of said capacitors is charged from said source while the other is discharged through said display at a frequency such that the display appears continuous to the eye.

7. A device as recited in claim 6, wherein said switching means comprises pulse controlled sources of current coupled with each of said capacitors.

8. A device as recited in claim 7, wherein said sources of current include transistors.

9. A device as recited in claim 6, including means coupled with said current source for varying the current charging said capacitor in response to ambient light.

10. A device as recited in claim 9, wherein said current varying means comprises a photoresistor.

11. A device as recited in claim 2, wherein said second switching means include a transistor for each digit adapted to be independently opened by pulses, and a transistor for each segment adapted to be independently opened by further pulses whereby pulses may be supplied to open said digit transistors only when corresponding segment transistors are open.

* * * * *